US008545664B2

(12) United States Patent
Odawara

(10) Patent No.: US 8,545,664 B2
(45) Date of Patent: Oct. 1, 2013

(54) TAPE APPLYING DEVICE, TAPE HOLDING UNIT, AND TAPE APPLYING METHOD

(75) Inventor: Kozo Odawara, Osaka (JP)

(73) Assignee: Panasonic Corporation, Osaka (JP)

( * ) Notice: Subject to any disclaimer, the term of this patent is extended or adjusted under 35 U.S.C. 154(b) by 8 days.

(21) Appl. No.: 13/580,751

(22) PCT Filed: Feb. 25, 2011

(86) PCT No.: PCT/JP2011/001114
§ 371 (c)(1),
(2), (4) Date: Aug. 23, 2012

(87) PCT Pub. No.: WO2011/105104
PCT Pub. Date: Sep. 1, 2011

(65) Prior Publication Data
US 2012/0318445 A1   Dec. 20, 2012

(30) Foreign Application Priority Data

Feb. 25, 2010   (JP) .................................. 2010-040305

(51) Int. Cl.
B29C 65/50 (2006.01)
B29C 65/56 (2006.01)
B32B 37/10 (2006.01)
B32B 37/12 (2006.01)
H05K 13/04 (2006.01)
G05G 15/04 (2006.01)
B32B 37/26 (2006.01)
B32B 38/10 (2006.01)
G05G 15/08 (2006.01)

(52) U.S. Cl.
USPC ........... 156/302; 156/250; 156/290; 156/297; 156/312; 156/358; 156/552; 156/553

(58) Field of Classification Search
USPC ................. 156/250, 290, 297, 312, 358, 552, 156/553
See application file for complete search history.

(56) References Cited

U.S. PATENT DOCUMENTS 7,076,867 B2 *   7/2006   Yamamoto et al. ............. 29/832
7,850,800 B2 * 12/2010   Ueno et al. ...................... 156/64

FOREIGN PATENT DOCUMENTS

| JP | 07307366 A | * | 11/1995 |
| JP | 3149679 | | 3/2001 |
| JP | 2008-159617 | | 7/2008 |
| JP | 2008-187087 | | 8/2008 |
| JP | 2009-16523 | | 1/2009 |
| WO | WO 2007069421 A1 | * | 6/2007 |

OTHER PUBLICATIONS

English translation of WO2007/069421; Jun. 2007.*
English translation of JP2009-061523; Jan. 22, 2009.*
English translation of JP07-307366; Nov. 21, 1995.*
International Preliminary Report on Patentability issued Sep. 18, 2012 in International (PCT) Application No. PCT/JP2011/001114, together with English translation thereof.
International Search Report issued May 31, 2011 in International (PCT) Application No. PCT/JP2011/001114.

* cited by examiner

Primary Examiner — Sonya Mazumdar
(74) Attorney, Agent, or Firm — Wenderoth, Lind & Ponack, L.L.P.

(57) ABSTRACT

A tape applying device for applying electrically conductive tape onto a board includes: a applying head for pressing the conductive tape; a tape holding unit including a reel section having a feed reel for feeding the conductive tape laminated with a separator and a wind-up reel to which the separator is to be wound up, and a tape guide section for guiding the conductive tape along with the separator to a position of pressing by the applying head; and a base section which has a tape guide driving unit for moving up and down the tape guide section, and to and from which the tape holding unit is fittable and removable. The tape guide section, while in a fitted state of being fitted to the base section, is separated from the reel section and moved up and down by driving force of the tape guide driving unit.

13 Claims, 11 Drawing Sheets

TAPE APPLYING DEVICE, TAPE HOLDING UNIT, AND TAPE APPLYING METHOD

TECHNICAL FIELD

The present invention relates to a tape applying device for applying a tape-like member such as ACF (Anisotropic Conductive Film) onto a board of a display panel or the like, and also relates to a tape holding unit to be used for the tape applying device as well as a tape applying method applicable to the tape applying device. It is noted that the display panel may be a liquid crystal panel, a PDP (Plasma Display Panel), an organic EL (Electro-Luminescence) panel, or the like.

BACKGROUND ART

For example, a liquid crystal panel module includes a display panel (hereinafter, referred to as a board), and electrodes provided in vicinities of peripheral portions of the board. To the electrodes, such components as IC chip, TCP (Tape Carrier Package), COF (Chip on Film) and FPC (Flexible Printed Circuit) are joined together via anisotropic conductive tape (hereinafter, referred to as conductive tape) as their electrical conductivity is ensured. Such a liquid crystal panel module is produced by a production system including a device (tape applying device) for applying conductive tape onto the electrodes of the board, a device for setting and temporarily press-bonding components onto the applied conductive tape, and a device for finally press-bonding the components.

The tape applying device, generally, includes a feed reel on which the conductive tape is wound together with a separator, an applying head for pressing the conductive tape onto an electrode of the board, and a wind-up reel for winding up the separator. The separator is a tape-like member to be fitted on one side of the conductive tape for prevention of tape-to-tape adhesion of the conductive tape wound on the reel and the like. The conductive tape fed from the feed reel is pressed against and thereby applied to the board while being heated by the applying head containing a heater. After the applying of the conductive tape, the separator is wound up to the wind-up reel.

The tape applying device further includes a tape guide section having a plurality of rollers. The tape guide section guides the conductive tape together with the separator from the feed reel to under the applying head, and guides the separator to the wind-up reel after the applying of the conductive tape.

The tape applying device controls and drives the above-described individual sections to achieve applying of the conductive tape to successively conveyed boards. As liquid crystal panels are produced, the conductive tape of the feed reel is consumed and the separator is wound up to the recovery reel. Therefore, in production of liquid crystal panels, there arises a need, from time to time, for tape replacement including processes of fitting the conductive tape to the feed reel, removing the separator from the recovery reel, and setting up the conductive tape and the separator by winding them on the tape guide section.

Conventionally, for simplification of the tape replacement, there has been proposed a tape applying device in which both reels and the tape guide section are integrally formed as a tape holding unit and provided so as to be fittable to and removable from a base section having a driving section for driving the two reels and rollers included in the tape guide section (see, e.g., PTL1). With such an arrangement, the tape holding unit can be removed from the tape applying device for tape replacement, making it easier to do the tape replacement.

For applying of the conductive tape to the board, this tape applying device lowers the tape holding unit to set the conductive tape close to board, and thereafter presses the conductive tape against the board by the applying head. As a result of this, heating and denaturation of the conductive tape before the applying of the conductive tape to the board can be prevented, so that shifts of the applying position or the like can be reduced.

PATENT LITERATURE

PTL1: JP 3149679 B2

In the conventional art, the whole tape holding unit is moved up and down for setting the conductive tape close to the board. In up/down move, the driving section for driving the feed reel, the wind-up reel and the rollers is also moved up and down in linkage with the tape holding unit. Therefore, the conventional art has an issue that the mechanism for moving up and down the tape holding unit becomes complicated and larger in scale.

In particular, for production of large-scale liquid crystal panel modules, a tape applying device including a plurality of applying heads is used so as to improve the production efficiency, and a plurality of tape holding units are placed in correspondence to the applying heads. With such a tape applying device, as the mechanism for moving up and down the tape holding units becomes complicated and larger in scale, there arises a need for enhancing the rigidity of the tape applying device or the like, posing a problem that the tape applying device as a whole becomes further larger in scale.

Accordingly, an object of the present invention, lying in solving the above-described problems, is to provide a structure of a tape applying device capable of simplifying the tape replacement without causing complication of the device structure and without increasing the device scale.

SUMMARY OF THE INVENTION

In order to achieve the above object, the present invention has the following constitutions.

According to a first aspect of a tape applying device of the present invention, there is provided a tape applying device for applying electrically conductive tape onto a board, comprising:

an applying head which presses the conductive tape;

a tape holding unit including a reel section having a feed reel from which the conductive tape laminated on a separator is fed and a wind-up reel to which the separator is to be wound up, and a tape guide section guiding the conductive tape along with the separator to a pressing position by the applying head; and a base section having a tape guide driving unit which moves up and down the tape guide section, the tape holding unit being fittable to and removable from the base section, wherein the tape guide section, while in a fitted state to the base section, is separated from the reel section and moved up and down by driving force of the tape guide driving unit.

According to a second aspect of the present invention, there is provided the tape applying device according to the first aspect, wherein the tape guide section is slid and moved relative to the reel section in the fitted state, thereby switching over between a separated state of being separated from the reel section and a coupled state of being coupled to the reel section.

According to a third aspect of the present invention, there is provided the tape applying device according to the second aspect, wherein the tape guide section includes:

a driving roller and a pinch roller for pinching and running the separator;

a first tension adjuster provided between the feed reel and a applying position where the conductive tape is applied by the applying head, the first tension adjuster adjusting a tension applied to the conductive tape and the separator upon a change from the coupled state to the separated state; and a second tension adjuster provided between the driving and pinch rollers and the wind-up reel, the second tension adjuster adjusting a tension applied to the separator upon a change from the coupled state to the separated state.

According to a fourth aspect of the present invention, there is provided the tape applying device according to the second aspect, wherein the base section has a lock mechanism which switches over between a locked state that the reel section is unremovably engaged with the base section and an open state that the reel section is removable from the base section, and the tape guide section has a switching aid part engaged with the lock mechanism in linkage with sliding movement for switching over between the separated state and the coupled state, so that the lock mechanism is switched over between a locked state in the separated state and an open state in the coupled state.

According to a fifth aspect of the present invention, there is provided the tape applying device according to the second aspect, wherein the tape guide section includes:

a first engagement portion provided in a fitting surface of the tape guide section facing the base section;

a positioning pin biased so as to be protruded outward from the fitting surface of the tape guide section; and a pin draw-in portion actuating the positioning pin so that the positioning pin is drawn inward of the fitting surface of the tape guide section against biasing force, and the base section includes:

a second engagement portion provided in a fitting surface of the base section opposed to the tape guide section; and a hole provided at a position of the fitting surface of the base section to which the positioning pin is opposed in the separated state, and wherein the first and second engagement portions are engaged with each other in the separated state so that the tape guide section is prevented from being separated from the base section, and mutual engagement thereof is released in the coupled state so that the tape guide section is removably fitted to the base section, and the positioning pin is fitted into the hole in the separated state.

According to a sixth aspect of the present invention, there is provided the tape applying device according to the second aspect, wherein the reel section includes:

either one of a coupling pin protruding in a sliding direction and a coupling hole forming a hole into which the coupling pin is to be fitted, and either one of a magnet and an attraction member both of which are provided in correspondence to each other so as to be attracted to each other by magnetic force, and wherein the tape guide section includes:

the other of the coupling pin and the coupling hole, and the other of the magnet and the attraction member.

According to a seventh aspect of the present invention, there is provided the tape applying device according to anyone of the first through sixth aspects, wherein the feed reel and the wind-up reel are placed in array so as to be overlapped with each other as viewed in a rotational-axis direction.

According to an eighth aspect of the present invention, there is provided the tape applying device according to the seventh aspect, wherein the feed reel and the wind-up reel are placed in array so that rotational axes thereof become coaxial with each other.

According to a ninth aspect of the present invention, there is provided the tape applying device according to the eighth aspect, wherein the base section includes:

a feed driving force transmitting part engaged with the feed reel in the fitted state so as to transmit driving force for driving of the feed reel to the feed reel; and a wind-up driving force transmitting part engaged with the wind-up reel in the fitted state so as to transmit driving force for driving of the wind-up reel to the wind-up reel, wherein the feed reel is placed closer to the base section than the wind-up reel, and a portion at which the feed driving force transmitting part is engaged with the feed reel is positioned outer than a portion at which the wind-up driving force transmitting part is engaged with the wind-up reel, as viewed from the rotational axis of the feed reel and the wind-up reel.

According to a tenth aspect of the present invention, there is provided the tape applying device according to anyone of the first through sixth aspects, wherein the reel section and the tape guide section are separated from each other in the separated state in which the tape guide section is separated from the reel section.

According to a first aspect of a tape holding unit of the present invention, there is provided a conductive tape holding unit for use in a tape applying device for applying electrically conductive tape onto a board, comprising:

a reel section including a feed reel from which the conductive tape laminated on a separator is fed and a wind-up reel to which the separator is to be wound up; and a tape guide section guiding the conductive tape and the separator, wherein the reel section and the tape guide section are fittable and removable in an integrally coupled state to and from the tape applying device, and the tape guide section is separable from the reel section in a state that the tape guide section is fitted to the tape applying device.

According to a first aspect of a tape applying method of the present invention, there is provided a tape applying method for applying electrically conductive tape onto a board by a tape applying device, comprising:

fitting a tape holding unit to a base section of the tape applying device, the tape holding unit including: a reel section having a feed reel from which the conductive tape laminated on a separator is fed and a wind-up reel to which the separator is to be wound up; and a tape guide section guiding the conductive tape and the separator;

sliding and moving the tape guide section relative to the reel section so that the reel section and the tape guide section are fixed to the base section as the reel section and the tape guide section are separated from each other;

moving down the tape guide section to near the board, with the tape guide section kept separated from the reel section, for applying of the conductive tape onto the board; and pressing the conductive tape, which is guided by the moved-down tape guide section, against the board, whereby applying the conductive tape to the board.

According to a second aspect of the tape applying method of the present invention, there is provided the tape applying method according to the first aspect, wherein in fitting the tape holding unit to the base section, the tape guide section is in a coupled state of being coupled with the reel section, and in sliding and moving the tape guide section, the tape holding unit, which is in a state of being fitted to the base section, makes the tape guide section slid and moved relative to the reel section, whereby the tape guide section is switched from the coupled state of being coupled with the reel section to a separated state of being separated from the reel section.

EFFECTS OF INVENTION

According to the present invention, the tape holding unit is fittable to and removable from the base section. Whereas tape replacement needs to be performed from time to time in production, the operator in charge of the work is allowed to execute the work off-line with the tape holding unit removed from the base section. As a result of this, tape replacement becomes easier to do, making it possible to enhance the working efficiency and the production efficiency. Further, the possibility that the operator may be injured due to contact with movable members and heat-generating members of the tape applying device is reduced, so that safety of the work can be secured.

Moreover, the tape guide section can be moved up and down relative to the reel section. Therefore, it becomes possible to move up and down the tape guide section with the reel section fixed to the base section, eliminating the need for moving up and down the driving section for driving of the reels of the tape holding unit to set the conductive tape close to the board. Thus, it becomes implementable to simplify the mechanism for setting the conductive tape close to the board, allowing the device to be smaller in scale.

BRIEF DESCRIPTION OF DRAWINGS

These aspects and features of the present invention will become clear from the following description taken in conjunction with the preferred embodiments thereof with reference to the accompanying drawings, in which.

DETAILED DESCRIPTION OF THE INVENTION

Figure 1:
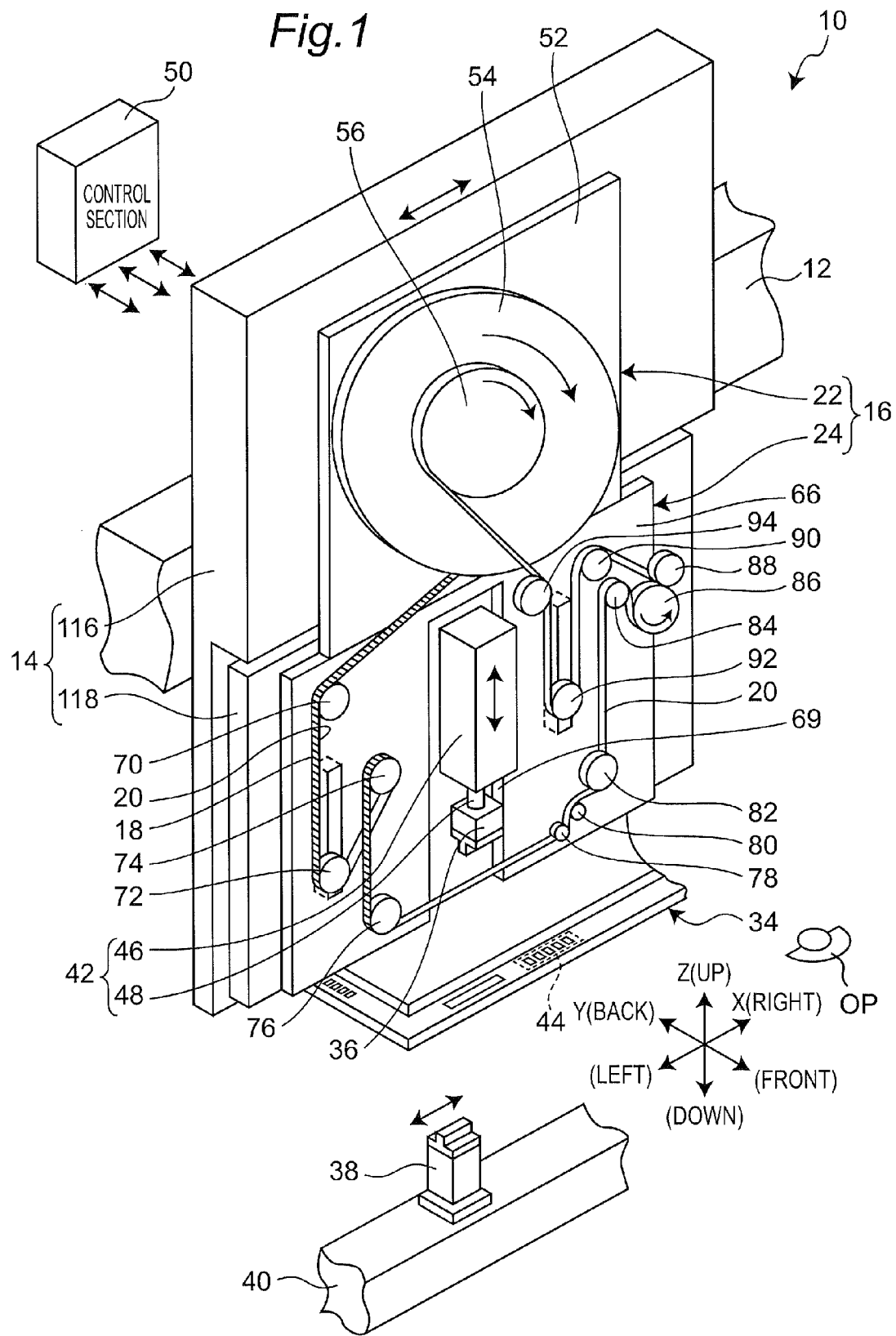
FIG. 1 is a perspective view showing an outline of a tape applying device according to an embodiment of the present invention.

Before the description of the present invention proceeds, it is to be noted that like parts are designated by like reference numerals throughout the accompanying drawings.

A tape applying device according to the present invention is a device for applying tape-like ACF (conductive tape) onto the board. The tape applying device is generally included in a production system which includes a temporary press-applying device for temporarily press-applying conductive tape applied by the tape applying device, a final press-applying device for finally press-applying the temporarily press-applied conductive tape, and a board conveying device for conveying the board in those individual devices.

The board is, for example, a display panel, such as an LCD panel or a plasma display panel, or the like. A plurality of electrodes are provided in array with a narrow pitch in vicinities of the periphery of the board, and the tape applying device applies conductive tape to predetermined applying positions so as to cover the plurality of electrodes.

FIG. 1 is a perspective view showing an outline of a tape applying device 10 according to an embodiment of the invention. Herein, the description will be given by using a back/forth direction (Y direction) with the operator (OP) assumed as front, a left/right direction (X direction) as viewed from the front, and a vertical up/down direction (Z direction), as shown in FIG. 1. These directions are used only for description of relative positional relationships, moving directions and the like, and it should not be construed that the invention is limited by those definitions.

The tape applying device 10 shown in FIG. 1 includes a base support member 12 fixed to a device casing (not shown) and extending in the left/right direction, a base section 14 fitted to the base support member 12, and a tape holding unit 16 fitted to the base section 14. The base section 14 is movable left and right along the base support member 12 by an unshown base driving section.

The driving section contains members that constitute a drive source for generating force to drive a driving object, and a driving mechanism for transmitting the driving force generated by the drive source to a driving object. This is the case also with individual driving sections described hereinbelow.

The tape holding unit 16 is fittable to and removable from the base section 14. The tape holding unit 16 has a reel section 22 for feeding conductive tape 18 overlaid on its one side with a separator 20 for prevention of tape-to-tape adhesion of the conductive tape 18 and for winding up the separator 20, and a tape guide section 24 for guiding the conductive tape 18. The reel section 22 and the tape guide section 24 are separable from each other. Therefore, with the tape holding unit 16 fitted to the base section 14 (in fitted state), there can be made changeover between a state that the reel section 22 and the tape guide section 24 are integrally coupled together (a coupled state shown in FIG. 1) and another state that the reel section 22 and the tape guide section 24 are fully separated from each other (a separated state shown in FIGS. 6, 7 and FIGS. 9, 10).

In the separated state, the reel section 22 and the tape guide section 24 are each fixed in position to the base section 14 so as to be unremovably engaged. The tape guide section 24 in the separated state is up/down movable relative to the reel section 22 by a tape guide driving base part 118 (later described in detail) included in the base section 14.

Figure 2:
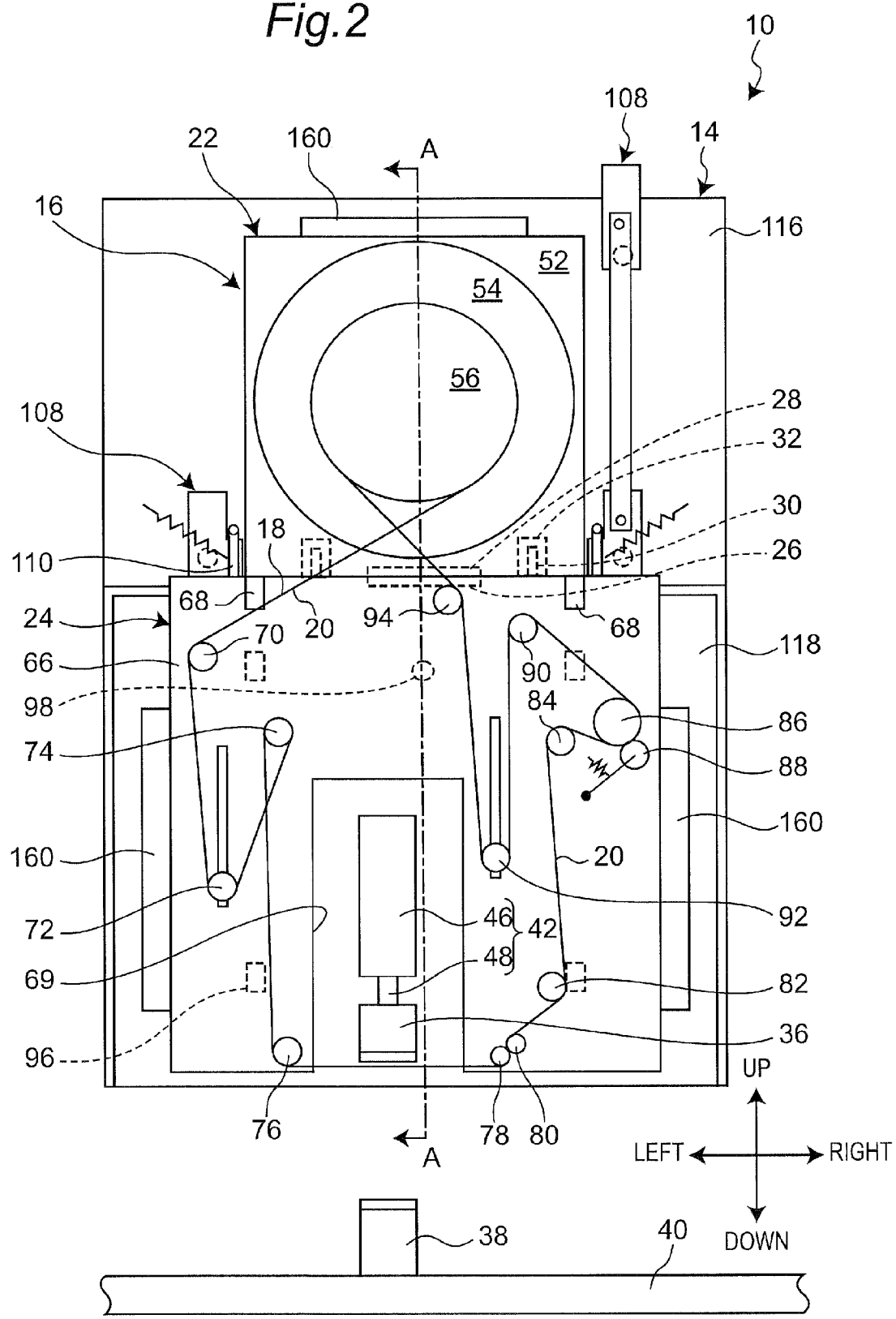
FIG. 2 is a front view of a base section and a tape holding unit in a coupled state out of their fitted states.
Figure 3:
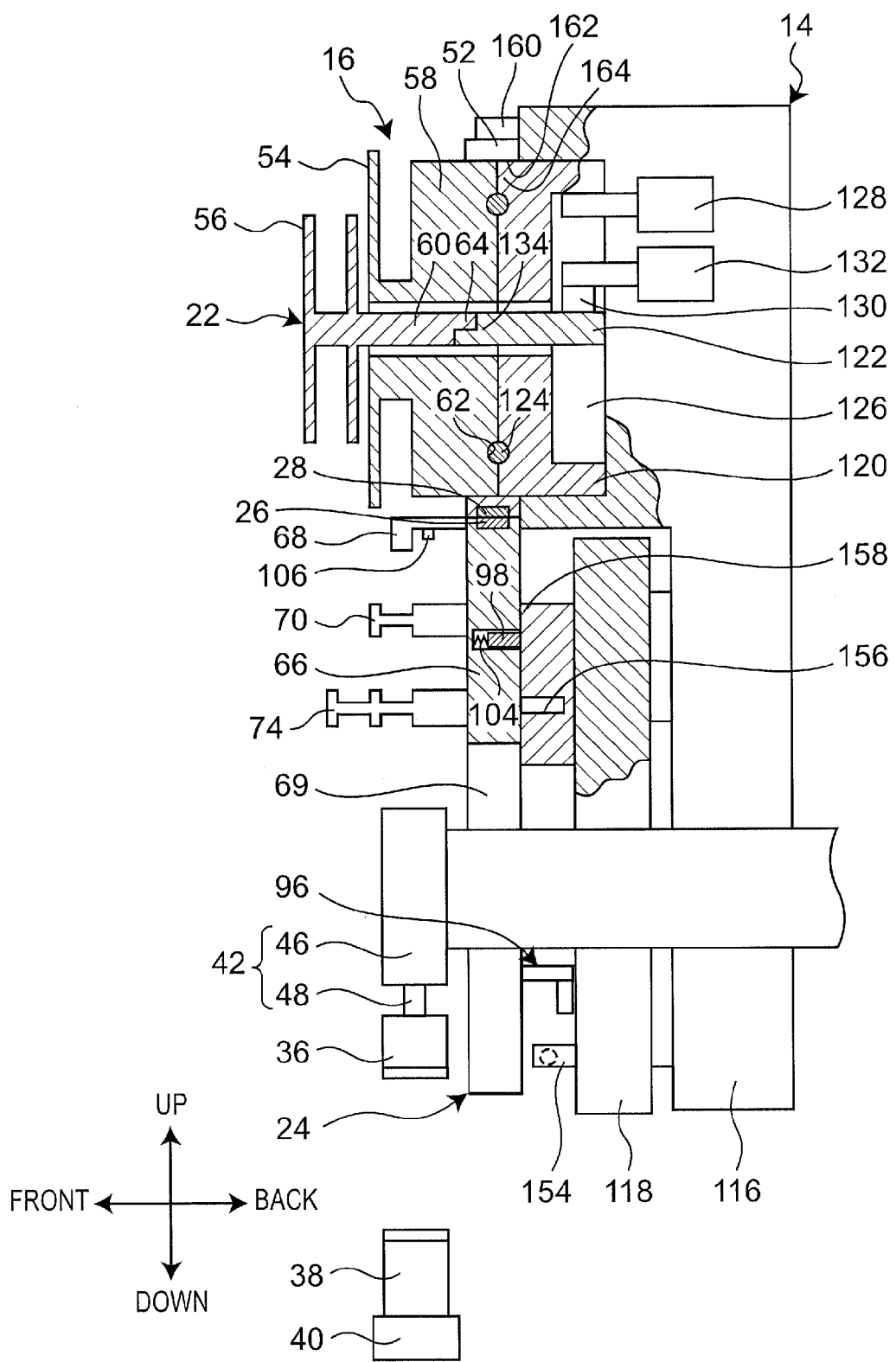
FIG. 3 is a side sectional view (partial sectional view) taken along the line A-A as the base section and the tape holding unit shown in FIG. 2 are viewed from the right.
Figure 5:
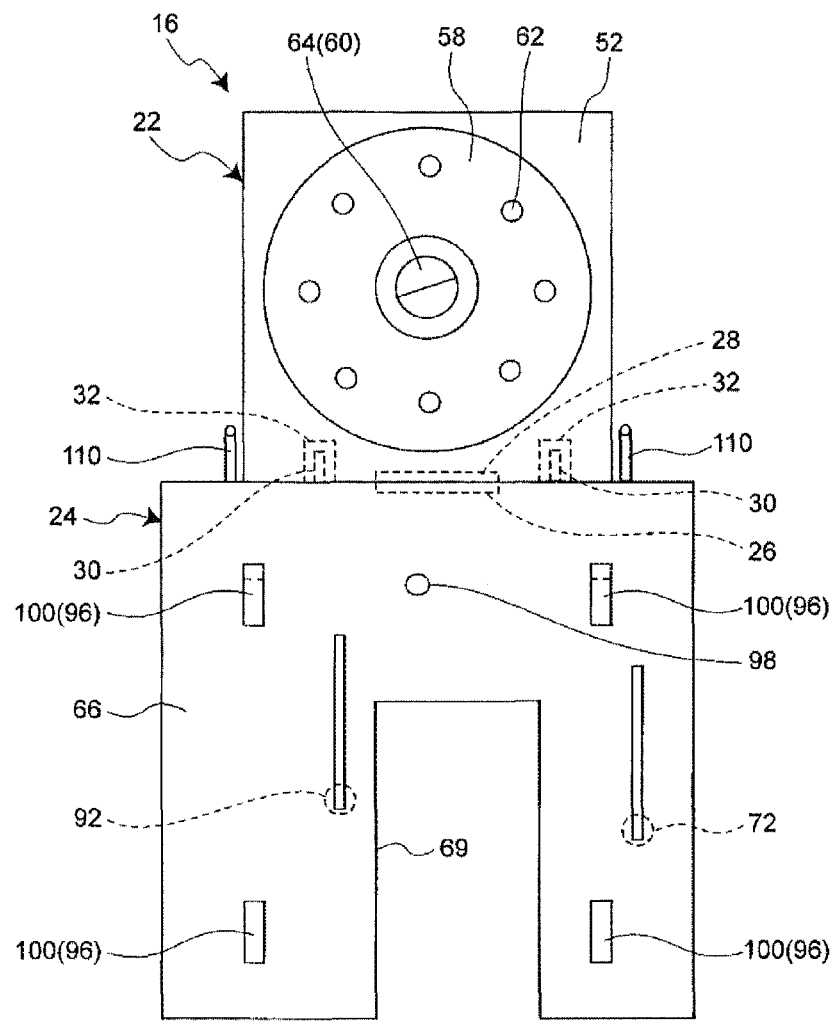
FIG. 5 is a rear view of the tape holding unit in a state that the tape holding unit is removed from the base section.

Also, in order to hold the coupled state at the time when the tape holding unit 16 is fitted to or removed from the base section 14, the reel section 22 has, in its lower end face, a metallic attraction member 28 (magnetically attractable member), and coupling holes 32 each forming an upwardly extending hole, as shown in FIGS. 2, 3 and 5. The attraction member 28 is provided near a center of the lower end face, and the coupling holes 32 are provided two in number outside both ends of the attraction member 28. Also, the tape guide section 24 has, in its upper end face, a magnet 26, and coupling pins 30 each upwardly extending to a length that allows the pins to be accommodated in the coupling holes 32. The magnet 26 and the coupling pins 30 are provided at such positions as to confront the attraction member 28 and the coupling holes 32, respectively, in the coupled state.

The tape applying device 10 shown in FIG. 1 also includes a applying head 36 for applying the conductive tape 18 to a board 34, a lower receiving portion 38 for supporting the board 34 from below the applying head 36 in applying of the conductive tape 18, and a lower-receiving support member 40 fitted to the device casing (not shown).

The applying head 36, which internally contains a heater (not shown), is driven by a head driving unit 42 so as to be moved up and down in a lower central portion of the base section 14. The applying head 36 is up-and-down movable independent of the tape guide section 24. As a result, the applying head 36 is moved down in front of the lower end of the tape guide section 24 while heating the conductive tape 18, press-applying the conductive tape 18 to an applying position 44 of the board 34.

The head driving unit 42 includes, for example, a rod 46 with the applying head 36 fitted at its lower end, a head support portion 48 fitted to the base section 14 to support the rod 46 so that the rod 46 can be moved up and down and moreover the head support portion 48 itself can also be moved up and down, a drive source (not shown) for providing driving force for moving up and down the rod 46 and driving force for moving up and down the head support portion 48, and a member (not shown) for transmitting the driving force generated by the drive source. The drive source is, for example, a motor, a gaseous or liquid pressure applying source, or the like.

The lower receiving portion 38 is fitted to the lower-receiving support member 40 and moved by a lower-receiving driving unit (not shown) leftward and rightward along the lower-receiving support member 40. As a result, the lower receiving portion 38 is placed under the applying head 36, which is moved together with the base section 14 leftward and rightward along the base support member 12, and supports the board 34 from below in applying process.

The tape applying device 10 further includes a control section 50. The control section 50 controls movement, drive and temperatures of the individual sections according to predetermined settings.

Now, structures of the base section 14 and the tape holding unit 16 are described below with reference to FIGS. 2 to 5.

Figure 4:
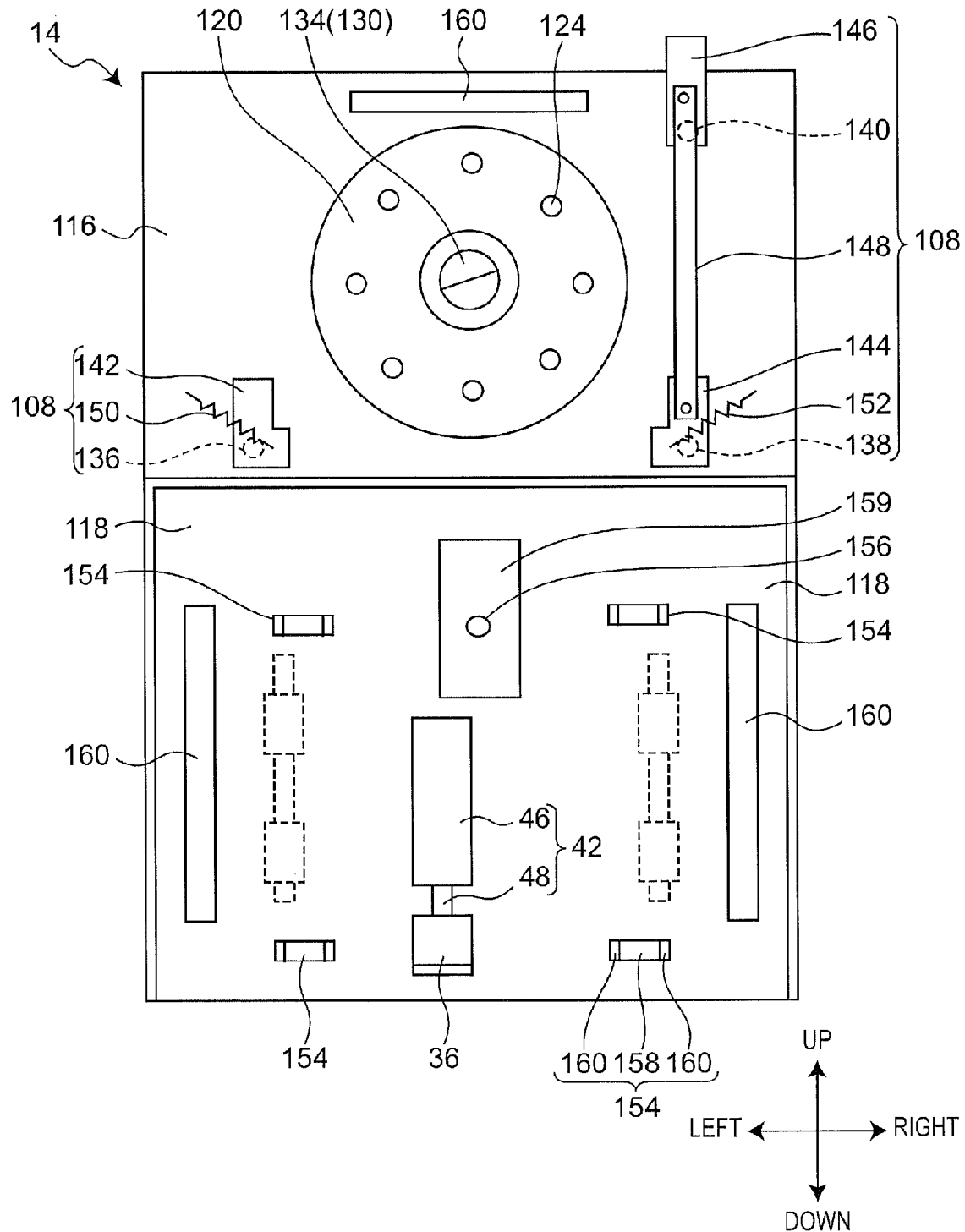
FIG. 4 is a front view of the base section in a state that the tape holding unit is removed from the base section.

FIG. 2 is a front view of the base section 14 and the tape holding unit 16 in a coupled state out of their fitted states. FIG. 3 is a side sectional view taken along the line A-A as the base section 14 and the tape holding unit 16 shown in FIG. 2 are viewed from the right. FIG. 4 is a front view of the base section 14 in a state (removed state) that the tape holding unit 16 has been removed from the base section 14. FIG. 5 is a rear view of the tape holding unit 16 in the removed state. It is noted that a front view is as viewed from the front shown in FIG. 1, and a rear view is as viewed from the rear shown in FIG. 1. In FIG. 3, the conductive tape 18 and the separator 20 are omitted.

The tape holding unit 16 includes the reel section 22 and the tape guide section 24 as described above.

The reel section 22 has a reel-side base portion 52 having in its rear a first unit-side fitting surface facing the base section 14, a feed reel 54 for feeding the conductive tape 18 laminated with the separator 20, a wind-up reel 56 for winding up the separator 20, a first rotating member 58 for transmitting driving force to the feed reel 54, and a first shaft member 60 for transmitting driving force to the wind-up reel 56.

The feed reel 54 and the wind-up reel 56 are fitted to the reel-side base portion 52 so as to be coaxially arrayed in the back/forth direction, and can be rotated in the same direction independently of each other by driving force provided from the base section 14. The reels 54, 56 of this embodiment are rotated clockwise as viewed from the front, as shown in FIG. 1. The feed reel 54 is provided closer to the reel-side base portion 52 than the wind-up reel 56.

The first rotating member 58 is a columnar member having circular surfaces at fore and rear ends, respectively, and having a hole formed so as to extend on a center given by an axis passing through the centers of the circular surfaces and extending in the back/forth direction, and the columnar member is rotatable about the axis. The first rotating member 58 is fixed to the feed reel 54 with its axis coincident with a rotational center of the feed reel 54. In the rearward circular surface of the first rotating member 58, a plurality of holes 62 to be engaged with a later-described plurality of small balls 124, respectively, are provided as a mechanism for receiving driving force provided from the base section 14. In this embodiment, eight holes 62 are provided at equal intervals on one circumference about the axis as a center as shown in FIG. 5, but the mechanism for receiving the driving force is not limited to this.

The first shaft member 60, which is rotatable about a major axis set in the back/forth direction, is fixed to the wind-up reel 56 so that the first shaft member 60 passes through the hole formed in the first rotating member 58 and its center axis becomes coincident with the rotational center of the wind-up reel 56. The rear end portion 64 of the first shaft member 60 has a so-called D-cut portion as a mechanism for receiving driving force provided from the base section 14. More specifically, the rear end portion 64 of the first shaft member 60 has its radial face partly cut in a radial direction orthogonal to the axial direction of the first shaft member 60 (the cutting is called D-cut because the axial cross section is cut into a D-like shape as viewed in the axial direction). It is noted that the mechanism for transmitting the driving force in the first shaft member 60 is not limited to this.

Between the first rotating member 58 and the first shaft member 60, bearings or other members are provided as required so that their rotational motions are kept from obstruction.

Next, the tape guide section 24 has a tape guide-side base portion 66 having rearward a second unit-side fitting surface opposed to the base section 14, a plurality of rollers 70-94 fitted to the tape guide-side base portion 66, and a handle 68 for holding by an operator in fitting or removing of the tape holding unit 16 to or from the base section 14. Also, a cutout portion 69 for forming a cutout from near center to lower end of the tape guide-side base portion 66 is provided. In the fitted state, the head driving unit 42 is placed in the cutout portion 69, thereby allowing the applying head 36 to move up and down in front of the tape guide-side base portion 66.

The plurality of rollers 70-94 guide the conductive tape 18 and the separator 20 fed out from the feed reel 54 to near the lower end of the cutout portion 69. Since the applying head 36 is placed in the cutout portion 69, the conductive tape 18 and the separator 20, in the fitted state, pass through a pressing position which is located under the applying head 36. The plurality of rollers further guide the separator 20 to the wind-up reel 56 after the conductive tape 18 in the pressing position has been applied by the applying head 36.

Here are explained details of the rollers 70-94.

The tape guide section 24 has a first guide roller 70, a first adjustment roller 72, a step gap roller 74, and a second guide roller 76, in this order from the feed reel 54 to the pressing position, as rollers for guiding the conductive tape 18 and the separator 20.

Also, the tape guide section 24 has first and second separating rollers 78, 80 provided in a paired form, a third guide roller 82, a fourth guide roller 84, a driving roller 86 and a pinch roller 88 provided in a paired form, a fifth guide roller 90, a second adjustment roller 92, and a sixth guide roller 94 as rollers for guiding the separator 20, as listed in order from the pressing position to the wind-up reel 56.

The first guide roller 70 is a roller for turning a direction of the conductive tape 18 and the separator 20 fed out from the feed reel 54 to a downward direction.

The first adjustment roller (first tension adjuster) 72 guides the conductive tape 18 and the separator 20 for passage through lower part from the left upper part toward the right upper part. The first adjustment roller 72 has a shaft which is movable along a vertically extending first groove portion provided in the tape guide section 24, and a biasing member (not shown) for biasing the shaft downward as required is provided. By deadweights and biasing force of the biasing member provided as required, tensile forces of the conductive tape 18 and the separator 20 are adjusted so as to be kept within their proper ranges.

The step gap roller 74 turns the direction of the conductive tape 18 and the separator 20 from left lower part to lower part while shifting forward a back-and-forth position of the conductive tape 18 and the separator 20 so that the conductive tape 18 having adhesiveness is prevented from contact with the step gap roller 74.

The second guide roller 76 is a roller for turning the direction of the conductive tape 18 and the separator 20 from upward to rightward.

The first and second separating rollers 78, 80 are a roller pair for guiding the separator 20 from leftward to rightward.

Between the second guide roller 76 and the first and second separating rollers 78, 80 is a pressing position located forward of the cutout portion 69 provided at a lower-part center of a tape guide board 34. The second guide roller 76 and the first separating roller 78 are so placed that the conductive tape 18 passes horizontally through the pressing position.

Also, between the second guide roller 76 and the pressing position is a cutter (not shown) provided for cutting the conductive tape 18. The first and second separating rollers 78, 80 are reciprocatingly movable left and right within a certain range while keeping in a relative positional relation between left lower and right upper part with a specified interval. After the conductive tape 18 cut into a specified length is applied to the board 34 by the applying head 36, the first and second separating rollers 78, 80 are moved leftward, making the separator 20 more easily separable from conductive tape 18. A driving unit for reciprocatingly moving left and right the first and second separating rollers 78, 80 is included in the base section 14.

Third and fourth guide rollers 82, 84 are rollers for turning the direction of the separator from leftward to upward, and subsequently from downward to right downward.

The driving roller 86 and the pinch roller 88 are a roller pair for allowing the separator 20 to stably run. The driving roller 86 and the pinch roller 88 have the separator 20 sandwiched therebetween, and the pinch roller 88 makes the separator 20 pressed against the driving roller 86 by a biasing member. As a result of this, rotation of the driving roller 86 is securely transmitted to the separator 20, allowing the separator 20 to run stably.

The fifth guide roller 90 is a roller for turning the direction of the separator 20 from right downward to downward.

The second adjustment roller 92 (second tension adjuster) guides the separator 20 for passage from right upper part through lower part toward left upper part. The second adjustment roller 92 has a shaft which is movable along a vertically extending second groove portion provided in the tape guide section 24, and a biasing member (not shown) for biasing the shaft downward as required is provided therein. By deadweights and biasing force of the biasing member provided as required, tensile force of the separator 20 is adjusted so as to be kept within its proper range.

The sixth guide roller 94 is a roller for turning the direction of the separator 20 from downward to left upward so that the separator 20 is wound up smoothly to the wind-up reel 56.

Now the description is returned to explanation on the structure of the tape guide section 24.

As shown in FIG. 5, the tape guide-side base portion 66 has, in the second unit-side fitting surface being its rear surface, unit-side engagement portions 96 to be engaged with the base section 14 so as to be kept from its forward separation from the base section 14 in the separated state, and a positioning pin 98 for fixing the tape guide section 24 in its up/down/left/right positions relative to the base section 14 in the separated state.

Figure 8:
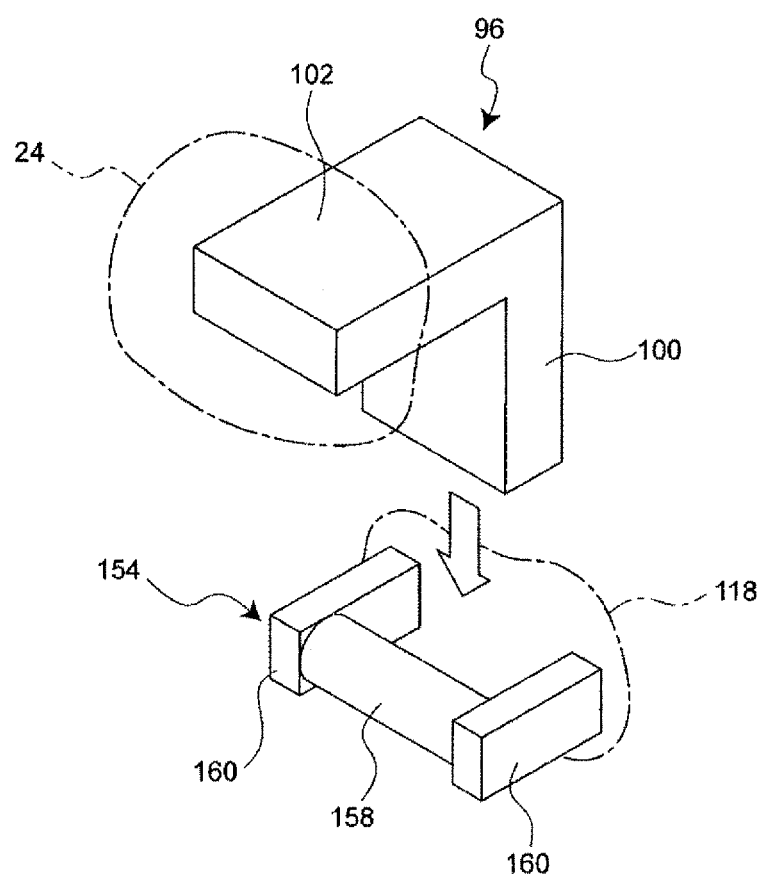
FIG. 8 is a view showing under magnification a base-side engagement portion and a unit-side engagement portion before engagement.
Figure 9:
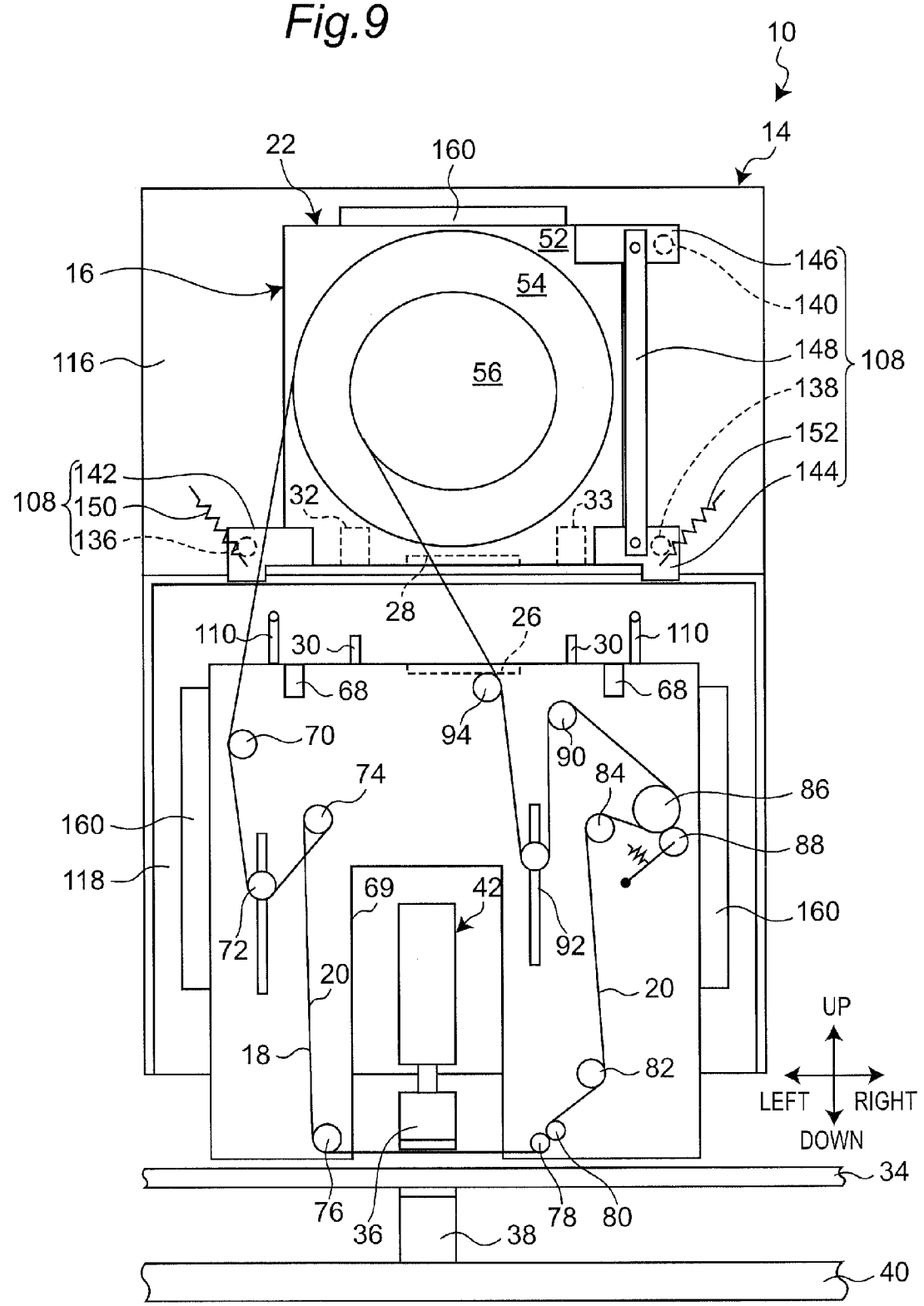
FIG. 9 is a front view showing the base section and the tape holding unit in an applying preparation state.

The unit-side engagement portions 96 are provided at four places of the second unit-side fitting surface. Each unit-side engagement portion 96 has an engagement portion 100 having a fixed surface opposed to the second unit-side fitting surface at a constant distance, and a protruding portion 102 for supporting an upper end of the engagement portion 100 and fixing the portion to the second unit-side fitting surface (see FIG. 8).

The positioning pin 98 is a pin biased by a spring 104 serving as a biasing member provided in a back/forth direction hole provided in the tape guide-side base portion 66 so that the positioning pin 98 is biased so as to be protruded rearward from the second unit-side fitting surface. The positioning pin 98 is allowed to protrude rearward (outward) from the second unit-side fitting surface and moreover to plunge forward (inside) of the second unit-side fitting surface by being fully accommodated in the hole up to the rear end of the positioning pin 98. The positioning pin 98 is associated with a button 106 (pin draw-in portion) provided in the handle 68 by using wire or the like so that pressing the button 106 (pressing upward in FIG. 3) causes the positioning pin 98 to plunge against biasing force of the spring 104.

The tape guide-side base portion 66 further has switching aid members 110 to be engaged with lock mechanisms 108

(details will be described later) included in the base section 14 as described later so as to switch the lock mechanisms 108 between locked state and open state. Each of the switching aid members 110 includes an engagement claw portion 112 extending to a specified length in the back/forth direction above the tape guide-side base portion 66, and a claw support portion 114 extending upward from an upper end face of the tape guide-side base portion 66 and having its upper end fixed to a forward end portion of the engagement claw portion 112 (see FIG. 7). The claw support portion 114 is provided outer in the left/right direction than the position where the reel section 22 is placed in the coupled state.

Next, the structure of the base section 14 is explained.

Figure 6:
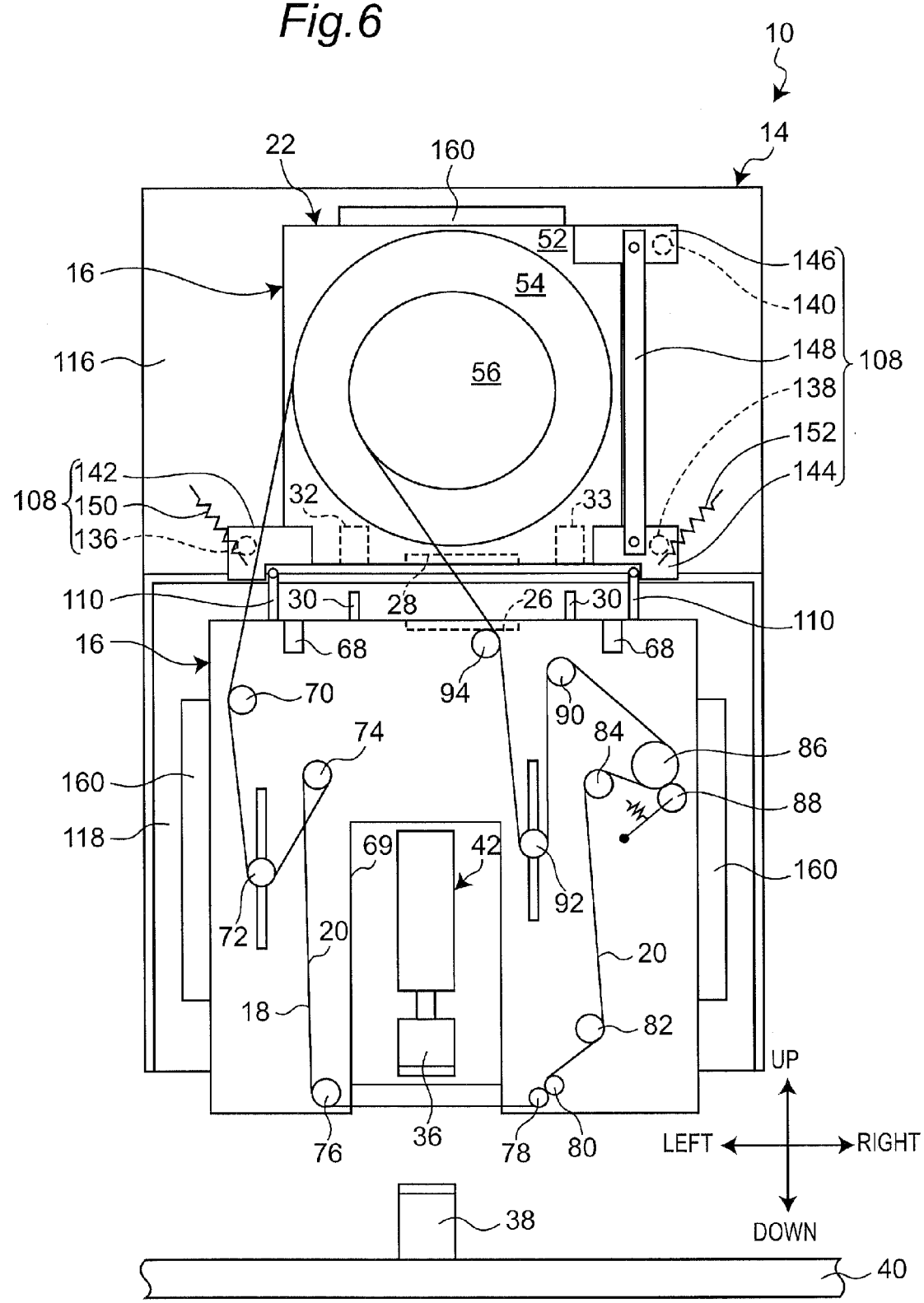
FIG. 6 is a front view showing the base section and the tape holding unit in a separated state out of their fitted states.

For example as shown in FIG. 6, the base section 14 includes a base body 116 having a first base-side fitting surface opposed to the reel section 22, and a tape guide driving unit for providing driving force for moving up and down the tape guide section 24 in the separated state. The tape guide driving unit includes a tape guide driving base part 118 having a second base-side fitting surface opposed to the tape guide section 24, and a drive source (not shown) for moving up and down the tape guide driving base part 118.

The base body 116 has, in the first base-side fitting surface, a second rotating member 120 as a wind-up driving force transmitting part for transmitting driving force for rotating the wind-up reel 56, and a second shaft member 122 as a feed driving force transmitting part for transmitting driving force for rotating the feed reel 54.

The second rotating member 120 is a columnar member having circular surfaces at fore and rear ends, respectively, and having a hole extending on a center given by an axis passing through the centers of the circular surfaces and extending in the back/forth direction, and the second rotating member 120 is rotatable about the axis.

In the forward circular surface of the second rotating member 120, a plurality of small balls 124 are provided as a mechanism for giving driving force to the first rotating member 58. Each of the small balls 124 is biased from rear to fore side by a spring or the like, where some of the small balls 124 are so sized as to be fittable to the holes 62 of the first rotating member 58 and are protruded forward of the forward circular surface, and the rest of the small balls are embedded in the second rotating member 120. In this embodiment, eight small balls 124 are provided at equal intervals about the center axis on a circumference of the same radius as the circumference on which the holes 62 of the first rotating member 58 are provided, but the mechanism for receiving the driving force is not limited to this.

In the rearward circular surface of the second rotating member 120, a recessed portion 126 having a circular-shaped cross section in the back/forth direction is formed. In an inner surface of the recessed portion 126, teeth to be meshed with a gear provided on the rotating shaft of a motor 128 are provided as an example, so that the second rotating member 120 is rotated by driving force of the motor 128.

The second shaft member 122, which is rotatable about a major axis set in the back/forth direction, is provided so that the second shaft member 122 passes through the hole formed in the second rotating member 120 and its center axis becomes coincident with the axis of the second rotating member 120. The second shaft member 122 is rotated by driving force of a motor 132 transmitted via a gear 130 as an example. A fore end portion 134 of the second shaft member 122 is subjected to D-cut process complementary to the rear end portion 64 of the first shaft member 60 as a mechanism for giving driving force to the first shaft member 60. The second shaft member 122 is biased forward by a biasing member (not shown) such as a spring, where the fore end portion 134 is protruded forward (outside) of the forward circular surface, but when pushed from the fore, is plunged rearward (inside) of the forward circular surface. In addition, between the second rotating member 120 and the second shaft member 122, bearings or other like members are provided so that their respective rotational motions are kept from obstruction.

The base body 116 further has, in the first base-side fitting surface, a lock mechanism 108 that can switch over between a locked state that the reel section 22 is unremovably engaged to the base section 14 and an open state that the reel section 22 is removable from the base section.

The lock mechanism 108 has first, second and third engagement portions 142, 144, 146 which are rotatable about shafts 136, 138, 140 fixed to the base body 116, and a link member 148 pivotally supported by the second and third engagement portions 144, 146.

The first, second and third engagement portions 142, 144, 146, in the open state (see, e.g., FIG. 2), release the reel section 22 fittable to and removable from the base body 116. In contrast to this, the first, second and third engagement portions 142, 144, 146, in the locked state (see, e.g., FIG. 6), are in contact with front portions of left lower, right lower and right upper corner portions the reel section 22, so that the reel section 22 is engaged so as to be inhibited from separating forward from the base body 116.

The first and second engagement portions 142, 144 are so shaped as to be engaged with the switching aid members 110 so that the engagement portions are rotated along with up/down sliding movement of the switching aid members 110. Also, whereas one-side ends of first and second springs 150, 152 are fixed to the base body 116, the other ends of the first and second springs 150, 152 are fitted to the first and second engagement portions 142, 144, respectively.

The first and second springs 150, 152 are enabled to switch over the direction of biasing the first and second engagement portions 142, 144 by movement of the positions of the other ends caused by rotations of the first and second engagement portions 142, 144. In this embodiment, for example, when the other end of the first spring 150 is positioned upper than a straight line passing through its one end and the rotating shaft 136 of the first engagement portion 142 (see FIG. 2), the first spring 150 biases the first engagement portion 142 toward its counterclockwise rotation. In this case, the first engagement portion 142 is engaged by a stopper (not shown) so as to be inhibited from rotating counterclockwise beyond a position out of contact with the left lower corner portion of the reel section 22. In contrast to this, when the other end of the first spring 150 is positioned upper than the straight line (see FIG. 6), the first spring 150 biases the first engagement portion 142 into its counterclockwise rotation. In this case, the first engagement portion 142 is engaged by a stopper (not shown) so as to be inhibited from rotating clockwise beyond a position of contact with a front of the left lower corner portion of the reel section 22. It is noted that the principle in which the second spring 152 switches over between the open state and the locked state by switching the direction of biasing the second engagement portion 144 is similar to the above case, and so detailed description of this is omitted.

The third engagement portion 146 is rotated by movement of the link member 148 in linkage with rotation of the first engagement portion 144. While the first engagement portion 144 is in the open state, the third engagement portion 146 is inhibited from contact with the reel section 22. Also, while the first engagement portion 144 is in the locked state, the third engagement portion 146 comes into contact with the front of the right upper corner portion of the reel section 22.

Next, the tape guide driving base part 118 has, in a second base-side fitting surface, base-side engagement portions 154 to be engaged with the unit-side engagement portions 96 in the separated state and released from the engagement in the coupled state, and a hole 156 provided at a position where the positioning pin 98 is fitted into the hole in the separated state.

The base-side engagement portions 154 are provided at four places associated with the unit-side engagement portions 96 so as to be engaged with the unit-side engagement portions 96 in the separated state. Each of the base-side engagement portions 154 has an engagement portion 158 formed of a bar material placed in parallel to the second base-side fitting surface with a constant distance therefrom, and a fixing member 160 for holding both ends of the engagement portion 158 to fix the engagement portion 158 to the tape guide driving base part 118 (see FIG. 8). Such an engagement portion 158 for the base-side engagement portions 154 is engaged with the engagement portion 100 of the unit-side engagement portion 96, by which the tape guide section 24 is inhibited from moving forward relative to the tape guide driving base part 118.

As the hole 156, a hole having a size that allows the positioning pin 98 to be fitted therein is formed at a position where the positioning pin 98 is fitted thereinto in the separated state. In this embodiment, the hole 156 is provided at a contact portion 159 that is in contact with the tape guide section 24 in the fitted state to thereby restrict rearward movement of the tape guide section 24. By the positioning pin 98 being fitted into the hole 156, the tape guide section 24 is inhibited from moving in up/down/left/right directions relative to the tape guide driving base part 118.

The base body 116 and the tape guide driving base part 118 have guide members 160, respectively, for fulfilling guide in fitting of the tape holding unit 16 to the first and second base-side fitting surfaces as required. The guide members 160 are ribs protruding forward from the first and second base-side fitting surfaces. In this embodiment, the guide members 160 are put into contact with an upper end portion and left-and-right end portions of the tape holding unit 16, respectively, to guide the tape holding unit 16 to a specified position.

In addition, in this embodiment, as shown in the side sectional view of FIG. 3 and the like, the first rotating member 58 is provided forward of the first unit-side fitting surface, by which a caved portion 162 is formed in the first unit-side fitting surface of the reel section 22. Also, the second rotating member 120 is provided so as to be protruded forward of the first base-side fitting surface of the base body 116, by which a protruding portion 164 is formed in the first base-side fitting surface of the base body 116. Therefore, the caved portion 162 and the protruding portion 164 function as guide members, so that the tape holding unit 16 can be fitted to the base section 14 so as to make the caved portion 162 and the protruding portion 164 fitted to each other. Also, by the caved portion 162 and the protruding portion 164 being fitted to each other, the reel section 22 and the base body 116 are fixed in their mutual positions in the up/down/left/right directions.

As described before, the reel section 22 of this embodiment has the two reels 54, 56 coaxially arrayed in the back/forth direction. As a result of this, it becomes practicable to make the reel section 22 compact.

Also, the feed reel 54 is provided closer to the reel-side base portion 52 than the wind-up reel 56. Since the conductive tape 18 and the separator 20 are wound on the feed reel 54, the feed reel 54 becomes larger in diameter than the wind-up reel 56 on which the separator 20 alone is wound. Therefore, such a positional relationship of the two reels 54, 56 makes it easier to fulfill the replenishment work of the conductive tape 18 laminated with the separator 20 to the feed reel 54 as well as the positional adjustment of the two reels 54, 56. Besides, it becomes possible to rotate the reels 54, 56 independently of each other with simple drive mechanisms.

Further, the base body 116 included in the base section 14 has the lock mechanism 108 for making the reel section 22 unremovably engaged therewith. Since no electrical sensor or the like is used, the base section 14 can be made compact. Also, the tape holding unit 16 only has the switching aid members 110. Therefore, it becomes practicable to make the tape holding unit 16 compact.

Also, in the separated state, the base-side engagement portions 154 and the unit-side engagement portions 96 are engaged with each other, respectively, by which the tape guide section 24 is inhibited from moving forward relative to the tape guide driving base part 118 included in the base section 14, while the tape guide section 24 is inhibited from moving in the up/down/left/right directions relative to the tape guide driving base part 118 by the positioning pin 98 being fitted into the hole 156. With such a simple construction, the tape guide section 24 can be fixed in position relative to the base section 14 (tape guide driving base part 118), so that the tape holding unit 16 and the base section 14 can be simplified in construction and thus made compact.

Further, the tape holding unit 16 keeps the coupled state resulting from removal of the tape holding unit 16 by engagement between the magnet 26 and the attraction member 28 as well as engagement between the coupling pins 30 and the coupling holes 32. With a simple construction using no electrical or mechanical force, the separation becomes easier to achieve and the coupled state can be maintained. Thus, it becomes practicable to make the tape holding unit 16 compact.

Figure 7:
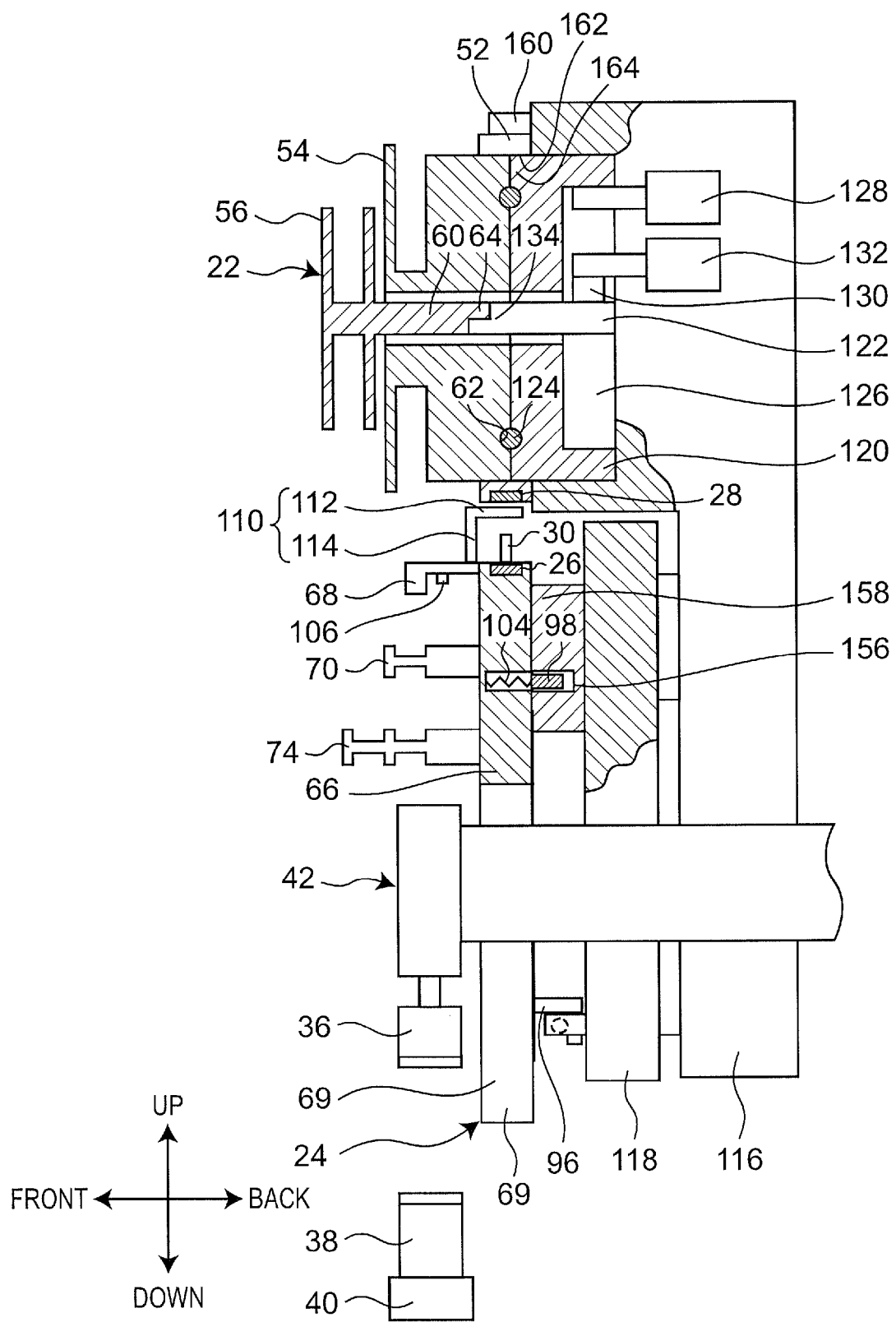
FIG. 7 is a side sectional view (partial sectional view) as the base section and the tape holding unit shown in FIG. 6 are viewed from the right as in FIG. 2.
Figure 10:
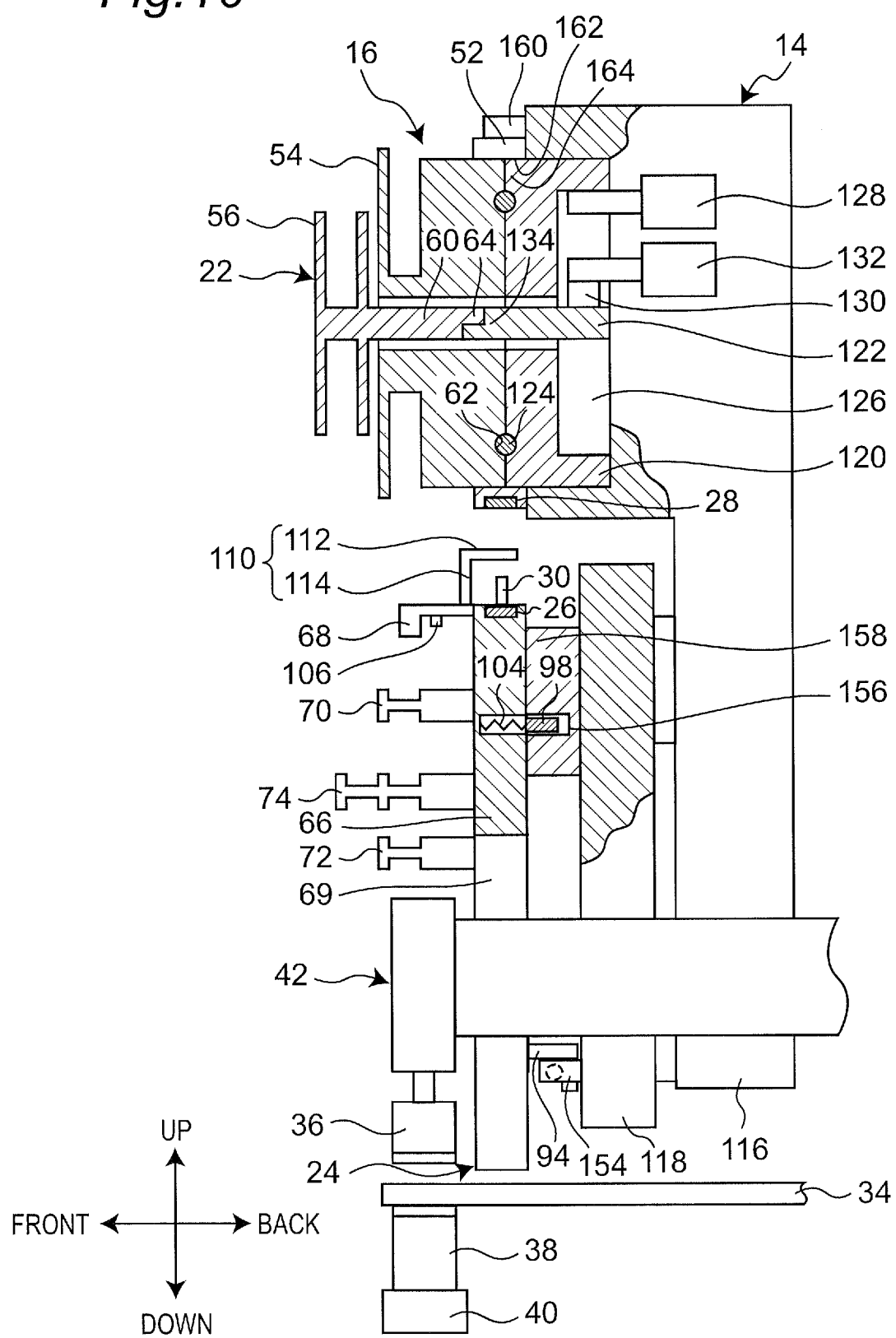
FIG. 10 is a side sectional view (partial sectional view) as the base section and the tape holding unit shown in FIG. 9 are viewed from the right as in FIG. 2.

Hereinbelow, a series of operations executed by the operator or the tape applying device 10 after the fitting of the tape holding unit 16 to the base section 14, including the applying of the conductive tape 18 to the board 34 by the tape applying device 10, until the removal of the tape holding unit 16 from the base section 14 will be described with reference to FIGS. 2 and 3 as well as FIGS. 6 to 11. In FIGS. 7 and 10, the conductive tape 18 and the separator 20 are omitted.

(Fitting of Tape Holding Unit 16)

The operator performs tape replacement of the tape holding unit 16. More specifically, the operator winds up the conductive tape 18 laminated with the separator 20 onto the feed reel 54, and moreover removes the separator 20 wound on the wind-up reel 56, sets the conductive tape 18 and the separator 20 to the tape guide section 24 by the above-described route, and fixes the end portion of the separator 20 to the wind-up reel 56. Thus, the conductive tape 18 and the separator 20 are set up on the tape holding unit 16.

The operator, while gripping the handle 68, presses the coupled-state tape holding unit 16 against the base section 14 from the front according to the guidance of the guide members 160. As a result, the tape guide section 24 is put into contact with the contact portion 159, and the tape holding unit 16 is put into a fitted state shown in FIGS. 2 and 3. In this case, the tape holding unit 16 is still in the coupled state.

(Separation of Tape Guide Section 24)

Subsequently, the operator presses the handle 68 downward, thereby making the tape holding unit 16 slid and moved downward. As a result, the engagement between the magnet 26 and the attraction member 28 as well as the engagement between the coupling pins 30 and the coupling holes 32 are released, so that the tape holding unit 16 is put into such a separated state as shown in FIGS. 6 and 7. The separated state is one of the fitted states.

In this case, the switching aid members 110 of the tape holding unit 16 are slid and moved downward so as to be engaged with the first and second engagement portions 142, 144. The first engagement portion 142 in the engaged state is rotated clockwise while the second engagement portion 144 in the engaged state is rotated counterclockwise, so that the lock mechanism 108 is put into the locked state. Simultaneously, the unit-side engagement portions 96 are moved in an arrow direction shown in FIG. 8, by which the base-side engagement portions 154 and the unit-side engagement portion 96 are engaged with each other and moreover the positioning pin 98 is fitted into the hole 156. As a result, the reel section 22 is fixed to the base body 116 while the tape guide section 24 is fixed to the tape guide driving base part 118.

Also, as the coupled state is switched over to the separated state, the distance from the feed reel 54 to the first guide roller 70 as well as the distance from the sixth guide roller 94 to the wind-up reel 56 are changed.

In this embodiment, a change in the distance from the feed reel 54 to the first guide roller 70 is absorbed by an upward move of the first adjustment roller 72. As a result, the tension applied to the conductive tape 18 and the separator 20 can be maintained proper. An adjustment roller having such a function may be provided, as required, between the roller provided immediately after the feed reel 54 (first guide roller 70 in this embodiment) and the roller for leading the conductive tape 18 and the separator 20 to the pressing position (second guide roller 76 in this embodiment).

Also, in this embodiment, a change in the distance from the sixth guide roller 94 to the wind-up reel 56 is absorbed by an upward move of the second adjustment roller 92. As a result, application of excessive tension to the separator 20 can be prevented. An adjustment roller having such a function may be provided, as required, between a roller pair for sandwiching the separator (driving roller 86 and pinch roller 88 in this embodiment) and the roller for guiding the separator 20 to the wind-up reel 56 (sixth guide roller 94 in this embodiment).

(Preparation for Applying of Conductive Tape 18)

The tape applying device 10 moves the base section 14 so that the applying position 44 of the board 34 is positioned under the applying head 36, and thereafter moves down the tape guide section 24 until the conductive tape 18 is placed at a distance of about 1 to several millimeters from the board 34. The tape applying device 10 is put into the applying preparation state shown in FIGS. 9 and 10. In this case, the applying head 36 is moved down while being held at a specified distance to the conductive tape 18. Since the tape guide section 24 is up-and-down movable, the conductive tape 18 can be set close to the board 34 before the applying of the conductive tape 18 as shown above. As a result of this, it becomes possible to apply the conductive tape 18 to the applying position 44 of the board 34 more accurately than in the case where the applying head 36 is moved from a position far from the board 34 to achieve the applying of the conductive tape 18 to the board 34. Also, the time for heating the conductive tape 18 by the applying head 36 until the conductive tape 18 is applied to the board 34 becomes an extremely short time duration required for the applying head 36 to press down the conductive tape 18 to 1 to several millimeters. Therefore, it becomes practicable to apply the conductive tape 18 to the board 34 without causing any heat denaturation of the conductive tape 18 almost at all.

As the tape guide section 24 is moved down, the distance from the feed reel 54 to the first guide roller 70 as well as the distance from the sixth guide roller 94 to the wind-up reel 56 are changed, whereas the tension of the conductive tape 18 and the separator 20 is maintained proper by the first adjustment roller 72 and the second adjustment roller 92 as in the case of the above-described separation operation of the tape guide section 24.

(Applying of Conductive Tape 18)

Figure 11:
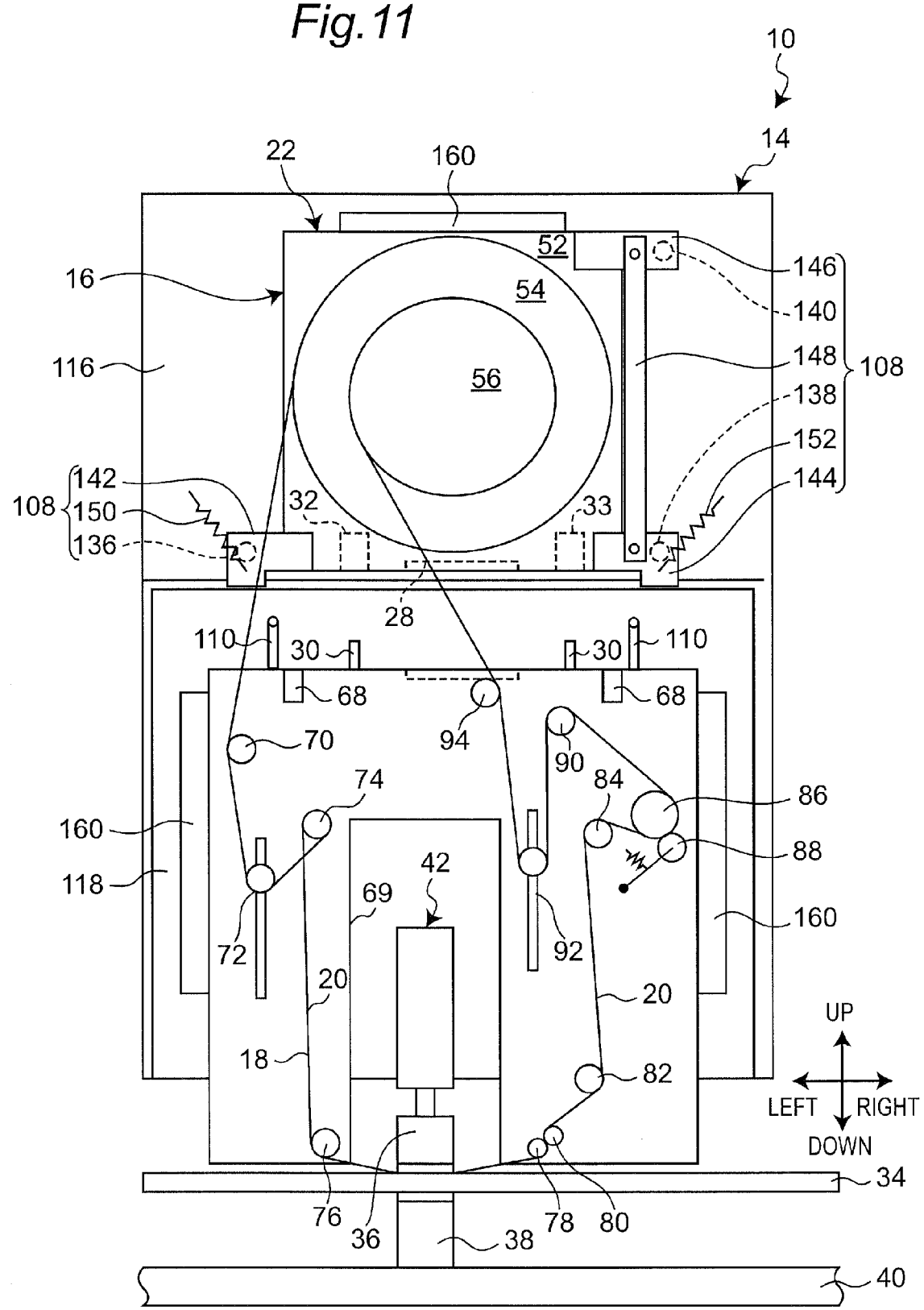
FIG. 11 is a front view showing the base section and the tape holding unit in applying of the conductive tape to the board.

The tape applying device 10 sets the lower receiving portion 38 to under the applying position 44, and moves down the applying head 36 so that the conductive tape 18 is heated and pressed to the applying position of the board 34 conveyed and placed at a specified position by the board conveying device (not shown) (see FIG. 11). As a result, the conductive tape 18 is applied to the board 34.

In a case where another applying position is provided so as to be arrayed in the left/right direction in one identical board 34, the tape applying device 10 moves the applying head 36 either leftward or rightward along with the base section 14 and the tape holding unit 16. Also, the tape applying device 10 sets the lower receiving portion 38 to under the applying head 36. Then, the tape applying device 10 applies the conductive tape 18 to the board 34 as described above. The tape applying device 10 repeats such applying operation as shown above, by which the conductive tape 18 is applied to the individual applying positions 44 of successively conveyed boards 34.

(Coupling of Tape Guide Section 24)

When the conductive tape 18 held on the feed reel 54 is fully consumed through repetitions of the applying operation, the operator presses the button 106 of the handle 68 to remove the tape guide section 24 from the base section 14. As a result, the positioning pin 98 is released from the hole 156, allowing the tape guide section 24 to be moved upward.

Subsequently, the operator lifts the handle 68 upward while pressing the button 106, by which the tape guide section 24 is slid and moved upward. As a result, the magnet 26 and the attraction member 28 as well as the coupling pins 30 and the coupling holes 32 are coupled together, respectively, so that the tape holding unit 16 is put into the coupled state shown in FIGS. 2 and 3.

In this case, the switching aid members 110 of the tape holding unit 16 are slid and moved upward so as to be engaged with the first and second engagement portions 142, 144. The engaged first engagement portion 142 is rotated counterclockwise while the engaged second engagement portion 144 is rotated clockwise, by which the lock mechanism 108 is put into a released state and simultaneously the engagement between the base-side engagement portion 154 and the unit-side engagement portion 96 is released. As a result, the reel section 22 becomes removable from the base body 116, and the tape guide section 24 becomes removable from the tape guide driving base part 118.

(Removal of Tape Holding Unit 16)

The operator, while gripping the handle 68, draws the coupled-state tape holding unit 16 forward according to the guidance of the guide members 160. As a result, the tape holding unit 16 is removed from the base section 14.

By repeating the operations described above, it becomes implementable to apply the conductive tape 18 to the board 34 while the tape replacement work is fulfilled as required.

Although an embodiment of the present invention has been described hereinabove, yet the invention is not limited to this embodiment.

For example, although the feed reel 54 and the wind-up reel 56 are placed coaxial to each other in the embodiment, yet the feed reel 54 and the wind-up reel 56 may be not necessarily placed coaxial to each other but arrayed back and forth so as to be overlapped with each other as viewed from the front. With this arrangement also, the reel section 22 can be made smaller in scale in the left/right direction than in the case where the feed reel 54 and the wind-up reel 56 are placed so as to be juxtaposed left and right.

For example, the embodiment has been described on an example in which in order to hold the coupled state in fitting or removal of the tape holding unit 16, the reel section 22 has the attraction member 28 and the coupling holes 32 while the tape guide section 24 has the magnet 26 and the coupling pins 30. However, each of the reel section 22 and the tape guide section 24 has only to have one and the other of the magnet 26 and the attraction member 28 as well as one and the other of the coupling pins 30 and the coupling holes 32, both provided at positions opposed to each other in the coupled state. Also, the attraction member, without being limited to metals, has only to be a member that is attracted to a magnet provided in correspondence thereto. Further, the coupling holes 32 and the coupling pins 30 are an example of the mechanism that by their coupling or engagement with each other in the coupled state, the reel section 22 and the tape guide section 24 are restrained from moving in a direction vertical to their sliding-movement direction (up/down direction). Besides, the magnet 26 and the attraction member 28 are an example of the mechanism that maintains the reel section 22 and the tape guide section 24 integrated together in the coupled state and moreover that makes those members separable from each other by proper force applied in their sliding movement.

For example, this embodiment has been described on an example in which the reel section 22 and the tape guide section 24 are fully separated from each other without any member for directly connecting together the two members in the separated state. However, the reel section 22 and the tape guide section 24 may also be made farther from each other in the up/down direction while being connected to each other, for example, by an LM guide, a guide shaft or the like so as to be movable relative to each other in the up/down direction. Herein, the farther-distanced state includes a state in which the reel section 22 and the tape guide section 24 are fully separated from each other (i.e., a state that the reel section 22 and the tape guide section 24 are separated from each other without involving any member for directly connecting the two members together: a separated state), and a state that the reel section 22 and the tape guide section 24 are set farther distanced relative to each other with some connection involved. In this case also, the tape guide section 24 can be moved up and down relative to the reel section 22, so that the mechanism for setting the conductive tape 18 closer to the board 34 can be simplified in construction and made smaller in scale.

Besides, with no connecting member and with full separation as in the embodiment, the LM guide, the guide shaft or the like is never worn by the up/down movement of the tape guide section 24, making it possible to reduce faults of the tape holding unit 16 so that its service life can be prolonged.

It is to be noted that, by properly combining the arbitrary embodiments of the aforementioned various embodiments, the effects possessed by them can be produced.

The present invention can be applied to tape applying devices to be used in production systems for display panel modules or the like and is applicable, for example, to devices for applying anisotropic conductive tape to display panel boards.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The entire disclosure of Japanese Patent Application No. 2010-40305 filed on Feb. 25, 2010, including specification, drawings, and claims are incorporated herein by reference in its entirety.

The invention claimed is:

1. A tape applying device for applying electrically conductive tape onto a board, comprising:

an applying head which presses the conductive tape;

a tape holding unit including a reel section having a feed reel from which the conductive tape laminated on a separator is fed and a wind-up reel to which the separator is to be wound up, and a tape guide section guiding the conductive tape along with the separator to a pressing position by the applying head; and a base section having a tape guide driving unit which moves up and down the tape guide section, the tape holding unit being fittable to and removable from the base section, wherein the tape guide section, while in a fitted state to the base section, is separated from the reel section and moved up and down by driving force of the tape guide driving unit, and the tape guide section is slid and moved relative to the reel section in the fitted state, thereby switching over between a separated state of being separated from the reel section and a coupled state of being coupled to the reel section.

2. The tape applying device according to claim 1, wherein the tape guide section includes:

a driving roller and a pinch roller for pinching and running the separator;

a first tension adjuster provided between the feed reel and a applying position where the conductive tape is applied by the applying head, the first tension adjuster adjusting a tension applied to the conductive tape and the separator upon a change from the coupled state to the separated state; and a second tension adjuster provided between the driving and pinch rollers and the wind-up reel, the second tension adjuster adjusting a tension applied to the separator upon a change from the coupled state to the separated state.

3. The tape applying device according to claim 1, wherein the base section has a lock mechanism which switches over between a locked state that the reel section is unremovably engaged with the base section and an open state that the reel section is removable from the base section, and the tape guide section has a switching aid part engaged with the lock mechanism in linkage with sliding movement for switching over between the separated state and the coupled state, so that the lock mechanism is switched over between a locked state in the separated state and an open state in the coupled state.

4. The tape applying device according to claim 1, wherein the tape guide section includes:

a first engagement portion provided in a fitting surface of the tape guide section facing the base section;

a positioning pin biased so as to be protruded outward from the fitting surface of the tape guide section; and a pin draw-in portion actuating the positioning pin so that the positioning pin is drawn inward of the fitting surface of the tape guide section against biasing force, and the base section includes:
a second engagement portion provided in a fitting surface of the base section opposed to the tape guide section; and
a hole provided at a position of the fitting surface of the base section to which the positioning pin is opposed in the separated state, and wherein
the first and second engagement portions are engaged with each other in the separated state so that the tape guide section is prevented from being separated from the base section, and mutual engagement thereof is released in the coupled state so that the tape guide section is removably fitted to the base section, and
the positioning pin is fitted into the hole in the separated state.

5. The tape applying device according to claim 1, wherein the reel section includes:
either one of a coupling pin protruding in a sliding direction and a coupling hole forming a hole into which the coupling pin is to be fitted, and
either one of a magnet and an attraction member both of which are provided in correspondence to each other so as to be attracted to each other by magnetic force, and wherein
the tape guide section includes:
the other of the coupling pin and the coupling hole, and the other of the magnet and the attraction member.

6. A tape applying device for applying electrically conductive tape onto a board, comprising:
an applying head which presses the conductive tape;
a tape holding unit including a reel section having a feed reel from which the conductive tape laminated on a separator is fed and a wind-up reel to which the separator is to be wound up, and a tape guide section guiding the conductive tape along with the separator to a pressing position by the applying head; and
a base section having a tape guide driving unit which moves up and down the tape guide section, the tape holding unit being fittable to and removable from the base section, wherein
the tape guide section, while in a fitted state to the base section, is separated from the reel section and moved up and down by driving force of the tape guide driving unit, and
the feed reel and the wind-up reel are placed in array so as to be overlapped with each other as viewed in a rotational-axis direction.

7. The tape applying device according to claim 6, wherein the feed reel and the wind-up reel are placed in array so that rotational axes thereof become coaxial with each other.

8. The tape applying device according to claim 7, wherein the base section includes:
a feed driving force transmitting part engaged with the feed reel in the fitted state so as to transmit driving force for driving of the feed reel to the feed reel; and
a wind-up driving force transmitting part engaged with the wind-up reel in the fitted state so as to transmit driving force for driving of the wind-up reel to the wind-up reel, wherein
the feed reel is placed closer to the base section than the wind-up reel, and
a portion at which the feed driving force transmitting part is engaged with the feed reel is positioned outer than a portion at which the wind-up driving force transmitting part is engaged with the wind-up reel, as viewed from the rotational axis of the feed reel and the wind-up reel.

9. A tape applying method for applying electrically conductive tape onto a board by a tape applying device, comprising:
fitting a tape holding unit to a base section of the tape applying device, the tape holding unit including: a reel section having a feed reel from which the conductive tape laminated on a separator is fed and a wind-up reel to which the separator is to be wound up; and a tape guide section guiding the conductive tape and the separator;
sliding and moving the tape guide section relative to the reel section so that the reel section and the tape guide section are fixed to the base section as the reel section and the tape guide section are separated from each other;
moving down the tape guide section to near the board, with the tape guide section kept separated from the reel section, for applying of the conductive tape onto the board; and
pressing the conductive tape, which is guided by the moved-down tape guide section, against the board, whereby applying the conductive tape to the board, wherein
in fitting the tape holding unit to the base section, the tape guide section is in a coupled state of being coupled with the reel section, and
in sliding and moving the tape guide section, the tape holding unit, which is in a state of being fitted to the base section, makes the tape guide section slid and moved relative to the reel section, whereby the tape guide section is switched from the coupled state of being coupled with the reel section to a separated state of being separated from the reel section.

10. The tape applying device according to claim 6, wherein the tape guide section includes:
a driving roller and a pinch roller for pinching and running the separator;
a first tension adjuster provided between the feed reel and a applying position where the conductive tape is applied by the applying head, the first tension adjuster adjusting a tension applied to the conductive tape and the separator upon a change from the coupled state to the separated state; and
a second tension adjuster provided between the driving and pinch rollers and the wind-up reel, the second tension adjuster adjusting a tension applied to the separator upon a change from the coupled state to the separated state.

11. The tape applying device according to claim 6, wherein the base section has a lock mechanism which switches over between a locked state that the reel section is unremovably engaged with the base section and an open state that the reel section is removable from the base section, and
the tape guide section has a switching aid part engaged with the lock mechanism in linkage with sliding movement for switching over between the separated state and the coupled state, so that the lock mechanism is switched over between a locked state in the separated state and an open state in the coupled state.

12. The tape applying device according to claim 6, wherein the tape guide section includes:
a first engagement portion provided in a fitting surface of the tape guide section facing the base section;
a positioning pin biased so as to be protruded outward from the fitting surface of the tape guide section; and a pin draw-in portion actuating the positioning pin so that the positioning pin is drawn inward of the fitting surface of the tape guide section against biasing force, and the base section includes:
- a second engagement portion provided in a fitting surface of the base section opposed to the tape guide section; and
- a hole provided at a position of the fitting surface of the base section to which the positioning pin is opposed in the separated state, and wherein
- the first and second engagement portions are engaged with each other in the separated state so that the tape guide section is prevented from being separated from the base section, and mutual engagement thereof is released in the coupled state so that the tape guide section is removably fitted to the base section, and
- the positioning pin is fitted into the hole in the separated state.

13. The tape applying device according to claim 6, wherein the reel section includes:
- either one of a coupling pin protruding in a sliding direction and a coupling hole forming a hole into which the coupling pin is to be fitted, and
- either one of a magnet and an attraction member both of which are provided in correspondence to each other so as to be attracted to each other by magnetic force, and wherein the tape guide section includes:
- the other of the coupling pin and the coupling hole, and
- the other of the magnet and the attraction member.

* * * * *